United States Patent
Nishimura et al.

(10) Patent No.: US 12,557,691 B2
(45) Date of Patent: Feb. 17, 2026

(54) SEMICONDUCTOR DEVICE AND SEMICONDUCTOR MODULE COMPRISING A POLYIMIDE FILM DISPOSED IN AN ACTIVE REGION AND A TERMINATION REGION AND A PASSIVATION FILM DISPOSED AS A FILM UNDERLYING THE POLYIMIDE FILM

(71) Applicant: Mitsubishi Electric Corporation, Tokyo (JP)

(72) Inventors: Kazuhiro Nishimura, Fukuoka (JP); Makoto Ueno, Fukuoka (JP); Shintaro Araki, Tokyo (JP); Atsunobu Kawamoto, Tokyo (JP); Masanori Tomioka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 470 days.

(21) Appl. No.: 17/424,054

(22) PCT Filed: Apr. 9, 2019

(86) PCT No.: PCT/JP2019/015459
§ 371 (c)(1),
(2) Date: Jul. 19, 2021

(87) PCT Pub. No.: WO2020/208706
PCT Pub. Date: Oct. 15, 2020

(65) Prior Publication Data
US 2022/0139794 A1 May 5, 2022

(51) Int. Cl.
*H01L 23/31* (2006.01)
*H01L 23/29* (2006.01)
(Continued)

(52) U.S. Cl.
CPC ...... *H01L 23/3171* (2013.01); *H01L 23/3135* (2013.01); *H01L 23/3192* (2013.01);
(Continued)

(58) Field of Classification Search
CPC ............. H01L 29/1608; H01L 29/7811; H01L 29/0619; H01L 23/3135; H01L 23/293;
(Continued)

(56) References Cited

U.S. PATENT DOCUMENTS

2006/0086939 A1   4/2006  Carta et al.
2008/0286968 A1*  11/2008  Carta .................. H01L 23/3192
                                                    257/E29.104
(Continued)

FOREIGN PATENT DOCUMENTS

CN   107359139 A   11/2017
JP   H04-005828 A   1/1992
(Continued)

OTHER PUBLICATIONS

JP-04212468-A Machine Translation (Year: 1992).*
(Continued)

*Primary Examiner* — David Chen
(74) *Attorney, Agent, or Firm* — Studebaker Brackett PLLC

(57) ABSTRACT

The present invention relates to a semiconductor device including: a semiconductor substrate having: an active region through which a main current flows; and a termination region around the active region; a polyimide film disposed in the active region and the termination region; and a passivation film disposed as a film underlying the polyimide film, wherein the termination region includes, in order from a side of the active region, a breakdown voltage holding region and an outermost peripheral region, the polyimide film is disposed except for a dicing remaining
(Continued)

portion of the outermost peripheral region, and the passivation film is disposed, as the underlying film, at least in a region where the polyimide film is disposed.

14 Claims, 13 Drawing Sheets

(51) Int. Cl.
H10D 62/10 (2025.01)
H10D 62/832 (2025.01)

(52) U.S. Cl.
CPC .......... *H01L 23/293* (2013.01); *H01L 23/296* (2013.01); *H01L 23/298* (2013.01); *H10D 62/106* (2025.01); *H10D 62/8325* (2025.01)

(58) Field of Classification Search
CPC . H01L 23/296; H01L 23/298; H01L 23/3157; H01L 23/3192; H01L 23/3171; H10D 62/106; H10D 12/035; H10D 12/038; H10D 12/441; H10D 12/481; H10D 30/0297; H10D 30/665; H10D 30/668; H10D 62/107; H10D 62/127; H10D 64/111; H10D 64/112; H10D 8/043; H10D 8/411; H10D 64/681; H10D 62/104; H10D 62/112
USPC ....... 257/77, 288, 339, 29.104; 438/17, 158, 438/233, 518, 597
See application file for complete search history.

(56) References Cited

U.S. PATENT DOCUMENTS

| | | | |
|---|---|---|---|
| 2010/0181627 A1* | 7/2010 | Willmeroth | H01L 24/03 257/536 |
| 2014/0061871 A1 | 3/2014 | Nagasawa | |
| 2015/0091161 A1 | 4/2015 | Tomita | |
| 2016/0174375 A1* | 6/2016 | Mizushima | H01L 24/83 29/829 |
| 2016/0181184 A1* | 6/2016 | Matsumoto | H01L 21/76852 257/751 |
| 2016/0260703 A1* | 9/2016 | Nakamura | H10D 64/519 |
| 2016/0316558 A1* | 10/2016 | Sakai | H01L 23/12 |
| 2017/0025521 A1* | 1/2017 | Nakagawa | H01L 29/41741 |
| 2017/0033028 A1 | 2/2017 | Negishi et al. | |
| 2017/0110545 A1* | 4/2017 | Nagao | H01L 23/535 |
| 2017/0317068 A1* | 11/2017 | Kaneda | H01L 29/66734 |
| 2018/0151719 A1* | 5/2018 | Sano | H01L 29/1608 |
| 2018/0182844 A1 | 6/2018 | Nakamura | |
| 2021/0233873 A1* | 7/2021 | Ito | H10D 62/8325 |

FOREIGN PATENT DOCUMENTS

| | | | | |
|---|---|---|---|---|
| JP | H04-127539 A | | 4/1992 | |
| JP | 04212468 A | * | 8/1992 | ............ H01L 29/402 |
| JP | 3133602 B2 | * | 2/2001 | ............... G03F 1/22 |
| JP | 2007-123926 A | | 5/2007 | |
| JP | 2014-049695 A | | 3/2014 | |
| JP | 2014096473 A | * | 5/2014 | |
| JP | 2014110277 A | * | 6/2014 | |
| JP | 5720647 B2 | | 5/2015 | |
| JP | 5943819 B2 | | 7/2016 | |
| JP | 2018-107303 A | | 7/2018 | |
| WO | 2015/166737 A1 | | 11/2015 | |

OTHER PUBLICATIONS

An Office Action; "Notice of Reasons for Refusal," mailed by the Japanese Patent Office on Oct. 25, 2022, which corresponds to Japanese Patent Application No. 2021-513060 and is related to U.S. Appl. No. 17/424,054; with English language translation.
International Search Report issued in PCT/JP2019/015459, mailed Jul. 2, 2019.
An Office Action; "Notice of Reasons for Refusal," mailed by the Japanese Patent Office on Apr. 26, 2022, which corresponds to Japanese Patent Application No. 2021-513060 and is related to U.S. Appl. No. 17/424,054 with English language translation.
An Office Action mailed by China National Intellectual Property Administration on Jul. 11, 2024, which corresponds to Chinese Patent Application No. 201980095117.3 and is related to U.S. Appl. No. 17/424,054; with English language translation.
An Office Action mailed by China National Intellectual Property Administration on Feb. 7, 2024, which corresponds to Chinese Patent Application No. 201980095117.3 and is related to U.S. Appl. No. 17/424,054; with English language translation.

* cited by examiner

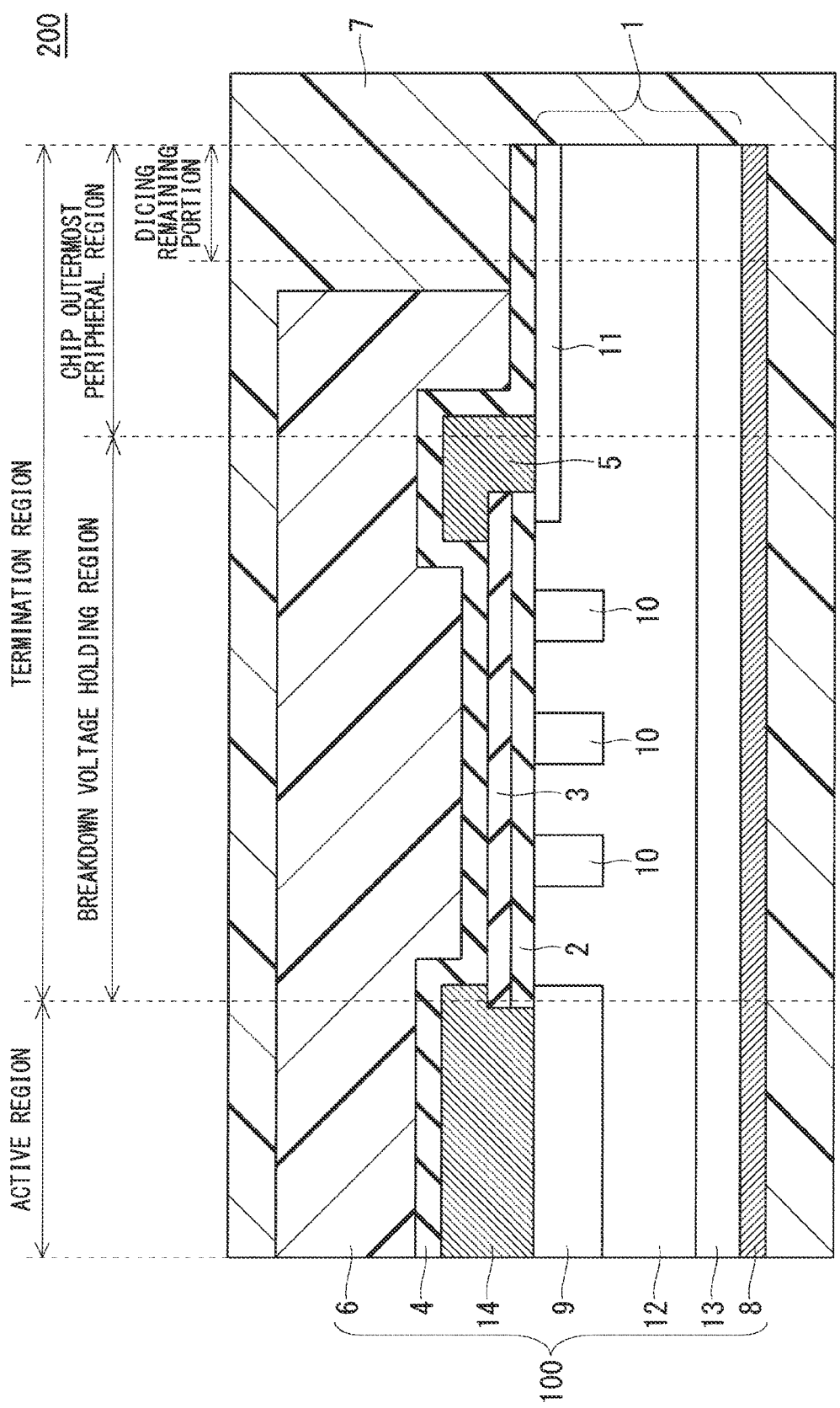
F I G. 1

F I G. 3
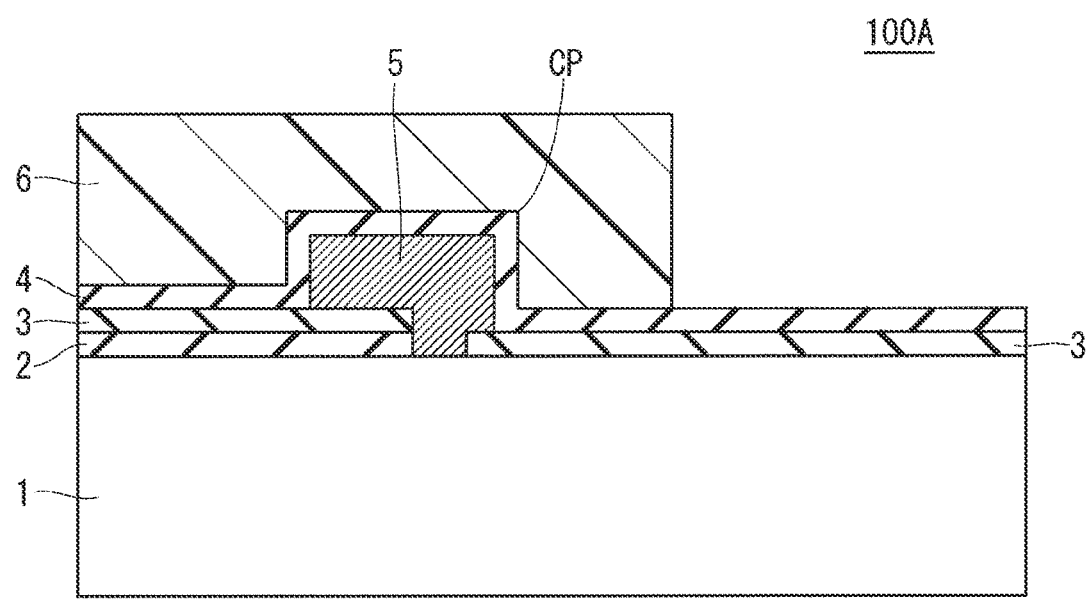

F I G. 5
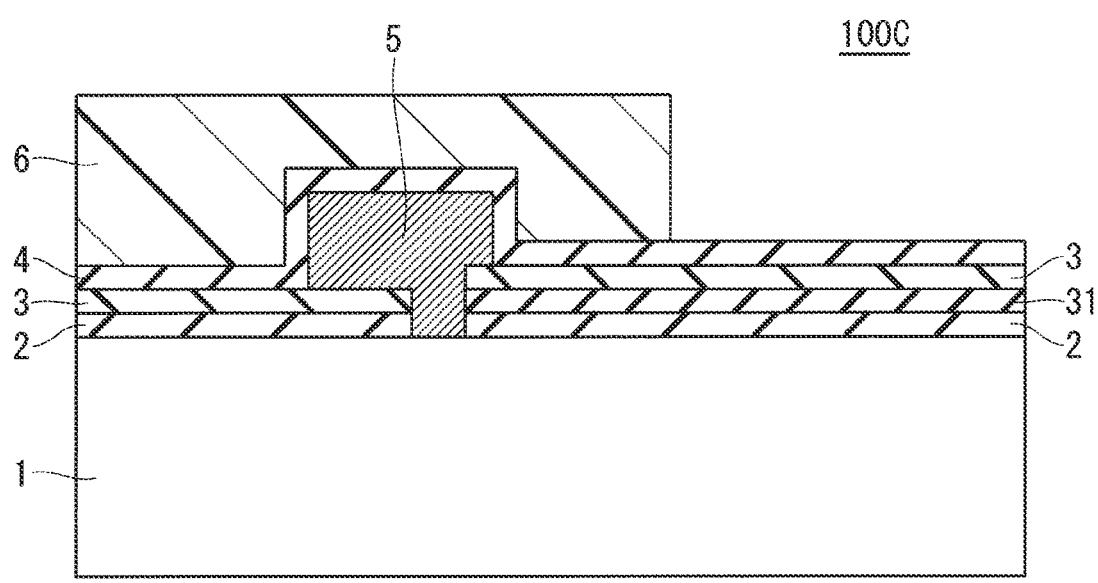

F I G. 6
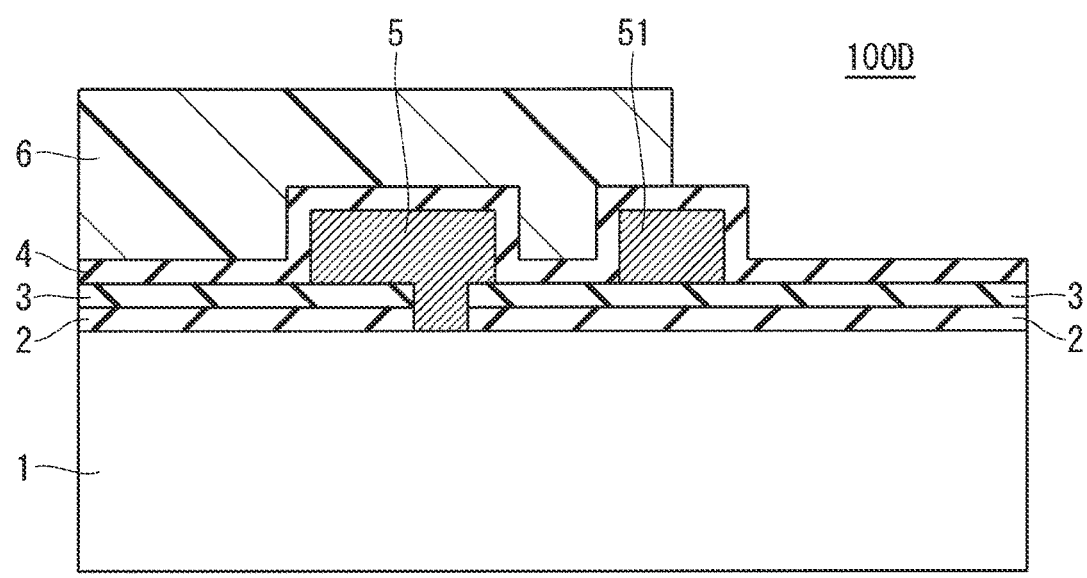

F I G. 9
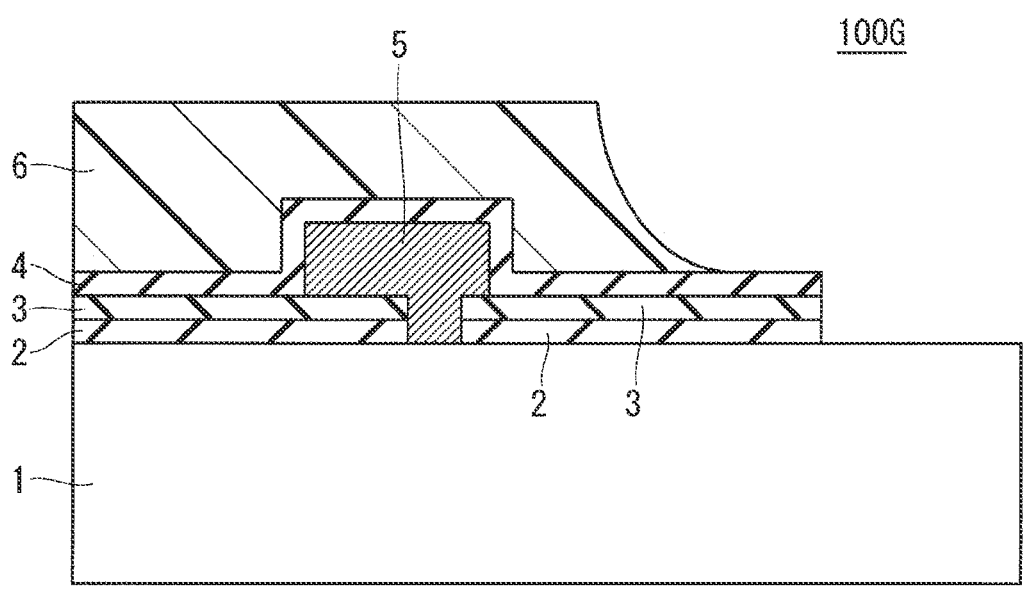

F I G. 1 1
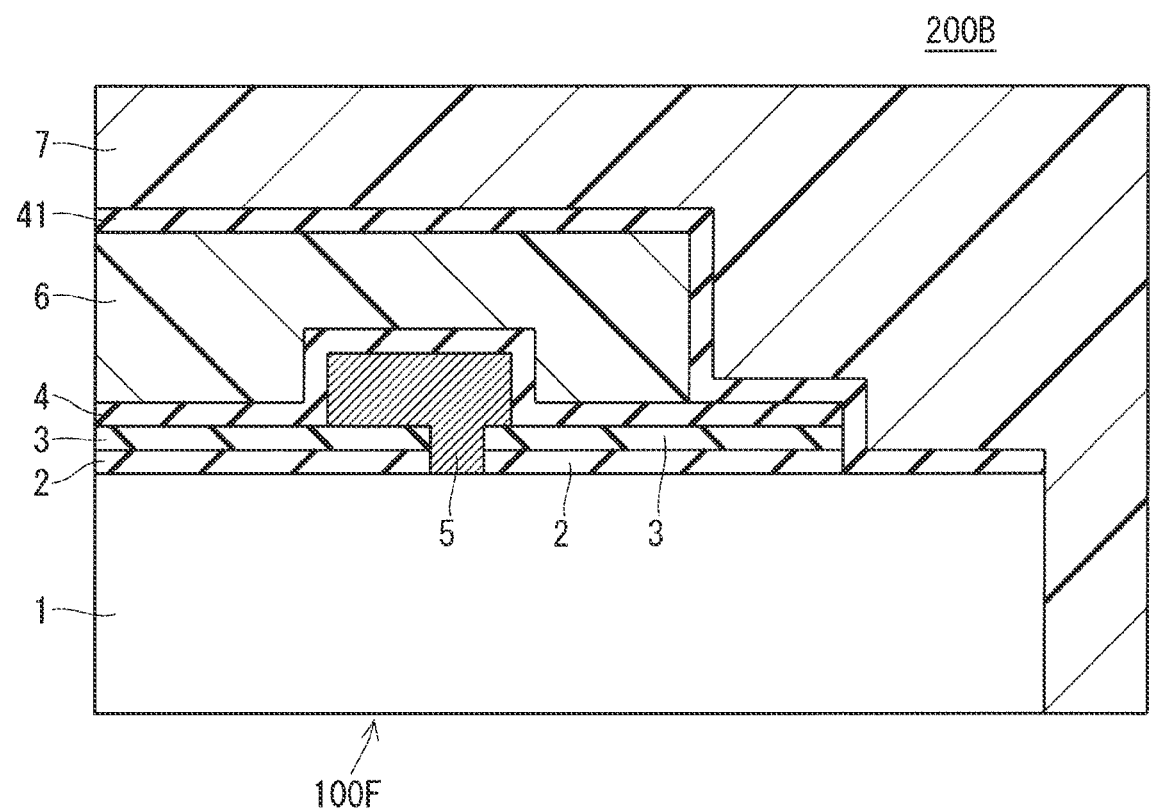

F I G. 1 2
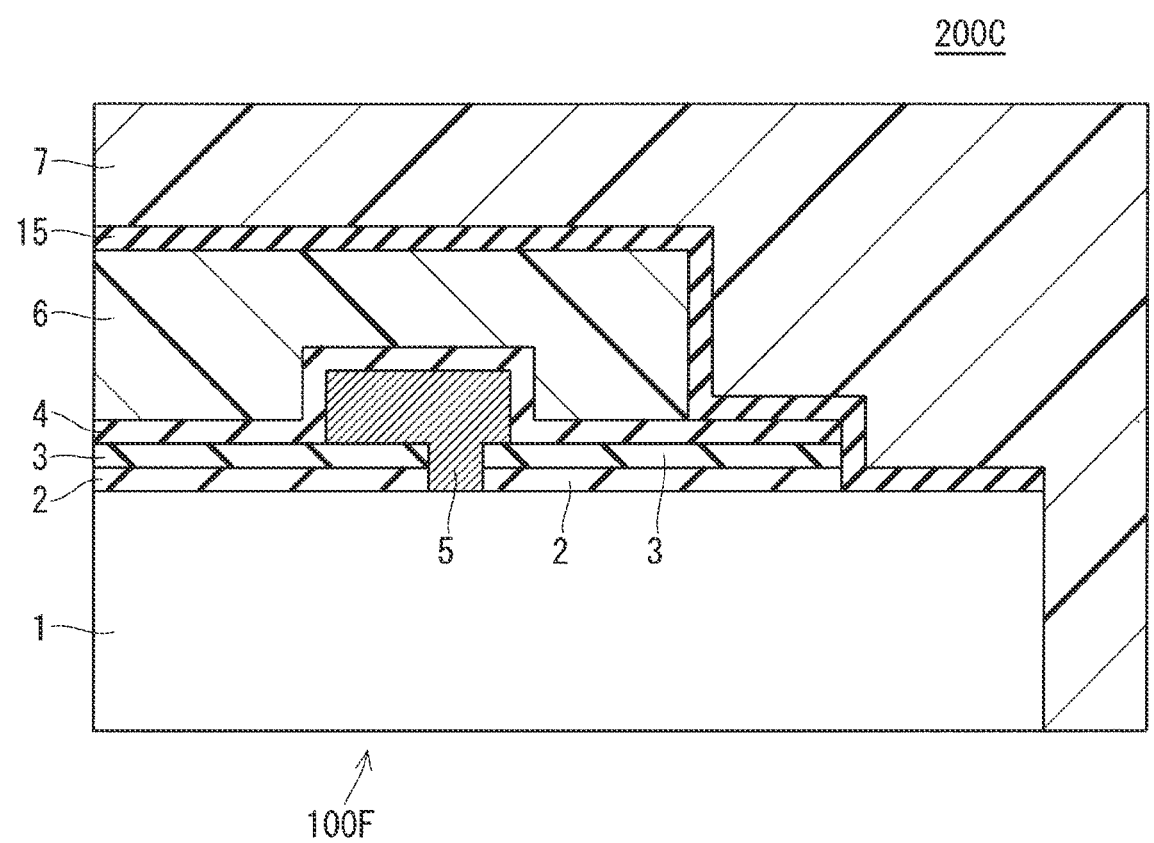

SEMICONDUCTOR DEVICE AND SEMICONDUCTOR MODULE COMPRISING A POLYIMIDE FILM DISPOSED IN AN ACTIVE REGION AND A TERMINATION REGION AND A PASSIVATION FILM DISPOSED AS A FILM UNDERLYING THE POLYIMIDE FILM

TECHNICAL FIELD

The present invention relates to semiconductor devices and, in particular, to semiconductor devices used in the field of power electronics, such as inverter devices.

BACKGROUND ART

A semiconductor device, such as an insulated gate bipolar transistor (IGBT), a metal-oxide semiconductor field effect transistor (MOSFET), and a diode, has an active region through which a main current flows and a termination region to hold a breakdown voltage. In the termination region, a dielectric and a passivation film are arranged over a semiconductor substrate for holding of the breakdown voltage and protection of the semiconductor device, and polyimide as an organic coating is further disposed over the dielectric and the passivation film for protection of an electrode and improvement of insulation.

Such a configuration is disclosed in FIG. 1 of Patent Document 1 and FIG. 4 of Patent Document 2, for example. In a peripheral breakdown voltage region in FIG. 1 of Patent Document 1, a dielectric and a nitride film as a first passivation film are formed over a semiconductor substrate, and a polyimide film as a second passivation film is formed on the nitride film.

Polyimide typically has photosensitivity but, due to variations in photosensitive performance, it is difficult to form the polyimide film so that an end surface of the polyimide film is flush with an end surface of a metal layer in a manufacturing process.

Although not explicitly shown in Patent Document 1, at an end edge of a semiconductor device in a breakdown voltage termination region in FIG. 4 of Patent Document 2, a polyimide film is formed to extend onto a semiconductor substrate to cover a dielectric and to be in contact with the semiconductor substrate. This structure is conventionally a typical structure at the end edge of the semiconductor device.

PRIOR ART DOCUMENTS

Patent Documents

Patent Document 1: Japanese Patent No. 5720647
Patent Document 2: Japanese Patent No. 5943819

SUMMARY

Problem to be Solved by the Invention

The polyimide film is conventionally in contact with the semiconductor substrate at the end edge of the semiconductor device. Thus, when the semiconductor device is sealed with a resin sealing material, such as an epoxy resin, stress might be concentrated on the semiconductor substrate at an end of the polyimide film upon application of thermal stress due to stress caused by expansion and contraction of the resin sealing material and polyimide, to cause cracking of the semiconductor substrate.

The present invention has been conceived to solve a problem as described above, and it is an object to provide a semiconductor device having reduced stress in a semiconductor substrate at an end of a polyimide film and having improved reliability.

Means to Solve the Problem

A semiconductor device according to the present invention includes: a semiconductor substrate having: an active region through which a main current flows; and a termination region around the active region; a polyimide film disposed in the active region and the termination region; and a passivation film disposed as a film underlying the polyimide film, wherein the termination region includes, in order from a side of the active region, a breakdown voltage holding region and an outermost peripheral region, the polyimide film is disposed except for a dicing remaining portion of the outermost peripheral region, and the passivation film is disposed, as the underlying film, at least in a region where the polyimide film is disposed.

Effects of the Invention

According to the semiconductor device according to the present invention, when thermal stress is applied to the semiconductor device, the passivation film functions as a stress buffer layer to reduce stress applied to the semiconductor substrate.

BRIEF DESCRIPTION OF DRAWINGS

FIG. 1 is a cross-sectional view illustrating a configuration of a termination region and a portion of an active region of a semiconductor module in Embodiment 1 according to the present invention.

FIG. 3 is a partial cross-sectional view illustrating the chip outermost peripheral region of a semiconductor device in Embodiment 2 according to the present invention.

FIG. 5 is a partial cross-sectional view illustrating the chip outermost peripheral region of a semiconductor device in Embodiment 4 according to the present invention.

FIG. 6 is a partial cross-sectional view illustrating the chip outermost peripheral region of a semiconductor device in Embodiment 5 according to the present invention.

FIG. 9 is a partial cross-sectional view illustrating the chip outermost peripheral region of a semiconductor device in Embodiment 8 according to the present invention.

FIG. 11 is a partial cross-sectional view illustrating the chip outermost peripheral region of a semiconductor module in Embodiment 10 according to the present invention.

FIG. 12 is a partial cross-sectional view illustrating the chip outermost peripheral region of a semiconductor module in Embodiment 11 according to the present invention.

DESCRIPTION OF EMBODIMENTS

Introduction

In description made below, an "active region" refers to a region through which a main current flows in an on state of a semiconductor device, and a "termination region" refers to a region around the active region. Hereinafter, "outward" refers to toward an outer periphery of the semiconductor device, and "inward" refers to the opposite of "outward", In description made below, as for a conductivity type of impurities, an N type and a P type opposite the N type are generally defined as a "first conductivity type" and a "second conductivity type", respectively, but the definitions may be reversed.

The drawings are schematically shown, and the sizes of and a positional relationship among images illustrated in different drawings are not necessarily accurate, and can be changed as appropriate. In description made below, similar components bear the same reference signs, and have similar names and functions. Detailed description thereof is thus sometimes omitted. In the present description, terms "on . . . " and "cover . . . " do not preclude the presence of any object interposed between components. For example, an expression "B disposed on A" or "A covering B" can mean that another component C is disposed or not disposed between A and B. In description made below, terms representing specific locations or directions, such as "upper", "lower", "side", "bottom", "front", and "back", are sometimes used for the sake of convenience for ease of understanding of the embodiments, but do not relate to directions in actual use.

Embodiment 1

Figure 2:
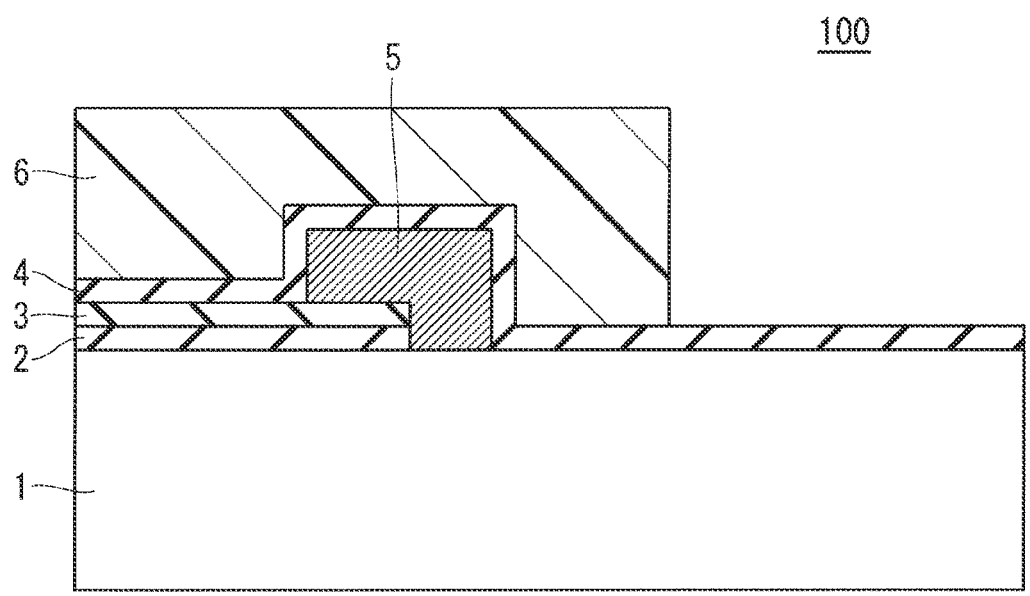
FIG. 2 is a partial cross-sectional view illustrating a chip outermost peripheral region of a semiconductor device in Embodiment 1 according to the present invention.

FIG. 1 is a cross-sectional view illustrating a configuration of a termination region and a portion of an active region of a diode module 200 in Embodiment 1 according to the present invention, and FIG. 2 is a partial cross-sectional view illustrating a chip outermost peripheral region of a diode chip 100 sealed in the diode module 200 with a resin. FIG. 2 illustrates only a characteristic configuration for the sake of convenience.

As illustrated in FIG. 1, a semiconductor substrate 1 of the diode module 200 is broadly divided into two regions, the active region and the termination region, and the termination region is divided into a breakdown voltage holding region and the chip outermost peripheral region in order from a side of the active region. The chip outermost peripheral region includes a dicing remaining portion as a remaining portion of a diced portion to be in contact with a cutting edge for dicing at dicing to divide the semiconductor substrate 1 into semiconductor chips.

The semiconductor substrate 1 illustrated in FIG. 1 is a silicon (Si) substrate, for example, and includes, in order from a back surface side on which a cathode electrode 8 is disposed, a buffer layer 13 containing a relatively high concentration ($N^+$) of impurities of the N type (first conductivity type) and a drift layer 12 containing a relatively low concentration ($N^-$) of impurities of the N type.

An upper portion of the drift layer 12 includes an anode 9 disposed in the active region and containing impurities of the P type (second conductivity type), a plurality of guard rings 10 arranged in the breakdown voltage holding region concentrically to surround the active region and containing impurities of the P type, and a field stop layer 11 disposed further outward than an outermost guard ring 10 and containing impurities of the N type.

On a front surface side of the semiconductor substrate 1, a silicon oxide film 2 is disposed to cover a portion from an end edge of the anode 9 to an inner end edge of the field stop layer 11, and an interlayer dielectric 3 is disposed on the silicon oxide film 2. An anode electrode 14 of metal is disposed on the anode 9, and a field stop electrode 5 of metal is disposed on the inner end edge of the field stop layer 11. A portion of the anode electrode 14 and a portion of the field stop electrode 5 are mounted on the interlayer dielectric 3, and a passivation film 4 is disposed to cover the anode electrode 14, the field stop electrode 5, and the interlayer dielectric 3. An end edge of the passivation film 4 extends to the chip outermost peripheral region, and an end surface thereof is flush with an end surface of the semiconductor substrate 1.

A polyimide film 6 is disposed in the active region and the termination region except for the dicing remaining portion, and the semiconductor substrate 1 as a whole including the polyimide film 6 is sealed with a resin sealing material 7, such as an epoxy resin.

The passivation film 4 herein includes a silicon oxide film (TEOS oxide film) formed using TEOS (tetraethoxysilane) having Young's modulus and a coefficient of linear expansion closer to those of polyimide and the epoxy resin than to those of the semiconductor substrate 1 of silicon. That is to say, physical property values of these materials are as follows.

silicon: Young's modulus 185 [GPa], coefficient of linear expansion 2.3 [ppm/° C.]
TEOS oxide film: Young's modulus 80.1 [GPa], coefficient of linear expansion 9 [ppm/° C.]
polyimide: Young's modulus 5 [GPa], coefficient of linear expansion 54 [ppm/° C.]
epoxy resin: Young's modulus 16 [GPa], coefficient of linear expansion 18 [ppm/° C.]

As described above, the passivation film 4 is formed as a film underlying the polyimide film 6, and the end edge of the passivation film 4 extends to the chip outermost peripheral region. Physical property values of the material for the passivation film 4 are closer to those of the polyimide film 6 and the resin sealing material 7 than those of the semiconductor substrate 1 are, so that a strain of the semiconductor substrate 1 when thermal stress is applied to the diode chip 100 is reduced. Furthermore, the passivation film 4 itself acts as a buffer film when stress is applied, so that stress in the semiconductor substrate 1 at the end edge of the polyimide film 6 is reduced, and the occurrence of cracking can be suppressed.

When the passivation film 4 includes the TEOS oxide film, stress in the semiconductor substrate 1 can further be reduced utilizing a low adhesion of the TEOS oxide film to the polyimide film.

That is to say, adhesion at an interface between the TEOS oxide film and polyimide is lower than adhesion at an interface between polyimide and silicon and adhesion at an interface between the epoxy resin and polyimide, and the polyimide film 6 and the passivation film 4 are likely to be separated from each other. When thermal stress is applied to the diode chip 100, separation at an interface between the polyimide film 6 and the passivation film 4 is promoted, and stress is distributed on the surface of the semiconductor substrate 1, so that stress in the semiconductor substrate 1 can be reduced.

When the polyimide film 6 and the passivation film 4 are separated from each other, an electrode protection function and an insulation improvement function of the polyimide film 6 can be reduced, but a function to reduce stress in the semiconductor substrate 1 is improved. A trade-off between these functions is thus considered in the design of the semiconductor device to optimize the specifications of the semiconductor device.

Although the diode is taken as an example in Embodiment 1, the configuration of the termination region in Embodiment 1 is applicable to the IGBT and the MOSFET as a basic structure of the termination region of each of the IGBT and the MOSFET is the same as that of the diode. The configuration of the termination region in Embodiment 1 is also applicable to all the semiconductor devices having similar termination regions.

Embodiment 2

FIG. 3 is a partial cross-sectional view illustrating the chip outermost peripheral region of a diode chip 100A in Embodiment 2 according to the present invention, and illustrates only a characteristic configuration for the sake of convenience as with FIG. 2.

As illustrated in FIG. 3, the diode chip 100A includes the interlayer dielectric 3 disposed in the chip outermost peripheral region as a film underlying the passivation film 4.

The interlayer dielectric 3 includes a silicon oxide film, a boro-phospho silicate glass (BPSG) film, and a phospho-silicate glass (PSG) film formed by chemical vapor deposition (CVD), for example. After the silicon oxide film 2 (thermal oxide film) is formed in the breakdown voltage holding region of the semiconductor substrate 1 by thermal oxidation (wet oxidation), the interlayer dielectric 3 is formed in the chip outermost peripheral region at the same time as the interlayer dielectric 3 is formed on the silicon oxide film 2.

As described above, the interlayer dielectric 3 is disposed as the film underlying the passivation film 4, so that a function to buffer stress on the semiconductor substrate 1 is enhanced to further reduce stress in the semiconductor substrate 1. That is to say, not only the silicon oxide film but also various other films can be formed by CVD, and the function to buffer stress on the semiconductor substrate 1 can be enhanced by selecting a film having physical property values closer to those of the polyimide film 6 and the passivation film 4.

The interlayer dielectric 3 is disposed as the film underlying the passivation film 4, so that a step between the passivation film 4 covering the field stop electrode 5 and a groundwork is reduced to suppress cracking of the passivation film 4.

That is to say, when the diode chip 100A is subjected to thermal stress in a state of being sealed with the epoxy resin and the like, the field stop electrode 5 is plastically deformed to apply stress to the passivation film 4 alone, so that cracking can occur at a corner CP where stress is most likely to be concentrated. The occurrence of cracking can be suppressed by minimizing deformation of the field stop electrode 5. By disposing the interlayer dielectric 3 to reduce the step between the passivation film 4 and the groundwork, the field stop electrode 5 becomes relatively thin, and becomes less likely to be deformed, so that the occurrence of cracking can be suppressed compared with the diode chip 100 in Embodiment 1.

Embodiment 3

Figure 4:
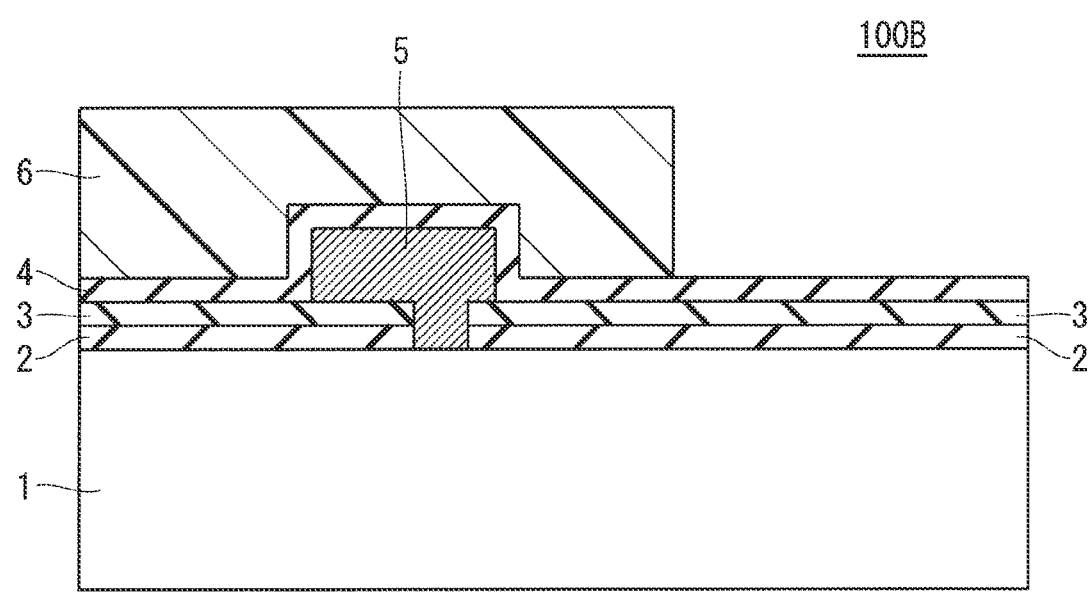
FIG. 4 is a partial cross-sectional view illustrating the chip outermost peripheral region of a semiconductor device in Embodiment 3 according to the present invention.

FIG. 4 is a partial cross-sectional view illustrating the chip outermost peripheral region of a diode chip 100B in Embodiment 3 according to the present invention, and illustrates only a characteristic configuration for the sake of convenience as with FIG. 2.

As illustrated in FIG. 4, the diode chip 100B includes, in the chip outermost peripheral region, the interlayer dielectric 3 disposed as the film underlying the passivation film 4 and being in contact with the passivation film 4, and the silicon oxide film 2 disposed as a film underlying the interlayer dielectric 3.

The silicon oxide film 2 is formed by thermal oxidation (wet oxidation). After the silicon oxide film 2 is formed in the breakdown voltage holding region and the chip outermost peripheral region of the semiconductor substrate 1 by thermal oxidation, any of the silicon oxide film, the BPSG film, and the PSG film is formed as the interlayer dielectric 3 on the silicon oxide film 2 by chemical vapor deposition (CVD), for example.

As described above, the interlayer dielectric 3 and the silicon oxide film 2 are arranged as the films underlying the passivation film 4, so that the function to buffer stress on the semiconductor substrate 1 is enhanced to further reduce stress in the semiconductor substrate 1.

The interlayer dielectric 3 and the silicon oxide film 2 are arranged as the films underlying the passivation film 4, so that the step between the passivation film 4 covering the field stop electrode 5 and the groundwork is reduced to suppress cracking of the passivation film 4.

Embodiment 4

FIG. 5 is a partial cross-sectional view illustrating the chip outermost peripheral region of a diode chip 100C in Embodiment 4 according to the present invention, and illustrates only a characteristic configuration for the sake of convenience as with FIG. 2.

As illustrated in FIG. 5, the diode chip 100C includes, in the chip outermost peripheral region, the interlayer dielectric 3 disposed as the film underlying the passivation film 4 and being in contact with the passivation film 4, a polysilicon film 31 disposed as the film underlying the interlayer dielectric 3, and the silicon oxide film 2 disposed as a film underlying the polysilicon film 31.

The polysilicon film 31 is formed by CVD, for example. After the silicon oxide film 2 is formed in the breakdown voltage holding region and the chip outermost peripheral region of the semiconductor substrate 1 by thermal oxidation, the polysilicon film 31 is formed on the silicon oxide film 2 in the chip outermost peripheral region by CVD. Polysilicon does not function as a conductor but functions as an insulator When not being doped with impurities, so that the polysilicon film 31 is formed not to be doped with impurities in Embodiment 4.

After the polysilicon film 31 is formed, any of the silicon oxide film, the BPSG film, and the PSG film is formed as the interlayer dielectric 3 on the silicon oxide film 2 in the breakdown voltage holding region and the polysilicon film 31 in the chip outermost peripheral region of the semiconductor substrate 1.

As described above, the interlayer dielectric 3, the polysilicon film 31, and the silicon oxide film 2 are arranged as the films underlying the passivation film 4, so that the function to buffer stress on the semiconductor substrate 1 is enhanced to further reduce stress in the semiconductor substrate 1.

The interlayer dielectric 3, the polysilicon film 31, and the silicon oxide film 2 are arranged as the films underlying the passivation film 4, so that the step between the passivation film 4 covering the field stop electrode 5 and the groundwork is reduced to suppress cracking of the passivation film 4.

The polysilicon film is a film used in formation of a gate electrode of the IGBT, the MOSFET, and the like. When the configuration of the termination region in Embodiment 4 is applied to the IGBT and the MOSFET, a step of forming the gate electrode can double as a step of forming the polysilicon film 31 to eliminate the need to add the step of forming the polysilicon film 31. In this case, the polysilicon film 31 is doped with impurities to be a conductor as with the gate electrode. The polysilicon film 31 as the conductor, however, has no effect on the performance of the semiconductor device as the polysilicon film 31 is disposed in a region of formation of the field stop electrode to which a depletion layer does not spread.

Embodiment 5

FIG. 6 is a partial cross-sectional view illustrating the chip outermost peripheral region of a diode chip 100D in Embodiment 5 according to the present invention, and illustrates only a characteristic configuration for the sake of convenience as with FIG. 2.

As illustrated in FIG. 6, the diode chip 100D includes, in the chip outermost peripheral region, the interlayer dielectric 3 disposed as the film underlying the passivation film 4 and being in contact with the passivation film 4, the silicon oxide film 2 disposed under the interlayer dielectric 3, and a dummy electrode 51 disposed on the interlayer dielectric 3 concentrically with the field stop electrode 5 and covered also with the passivation film 4.

The dummy electrode 51 is made of the same material as the field stop electrode 5, such as AlSi, and is formed by the same manufacturing method as the field stop electrode 5, such as vapor deposition and sputtering.

As described above, the dummy electrode 51 is disposed under the passivation film 4 in the chip outermost peripheral region, so that the function to buffer stress on the semiconductor substrate 1 is enhanced to further reduce stress in the semiconductor substrate 1.

AlSi is an electrode material used in the manufacture of the semiconductor device. If the anode electrode 14 illustrated in FIG. 1 is formed of AlSi, a step of forming the dummy electrode 51 can double as a step of forming the anode electrode 14 to eliminate the need to add the step of forming the anode electrode 14. The same applies to the field stop electrode 5.

Embodiment 6

Figure 7:
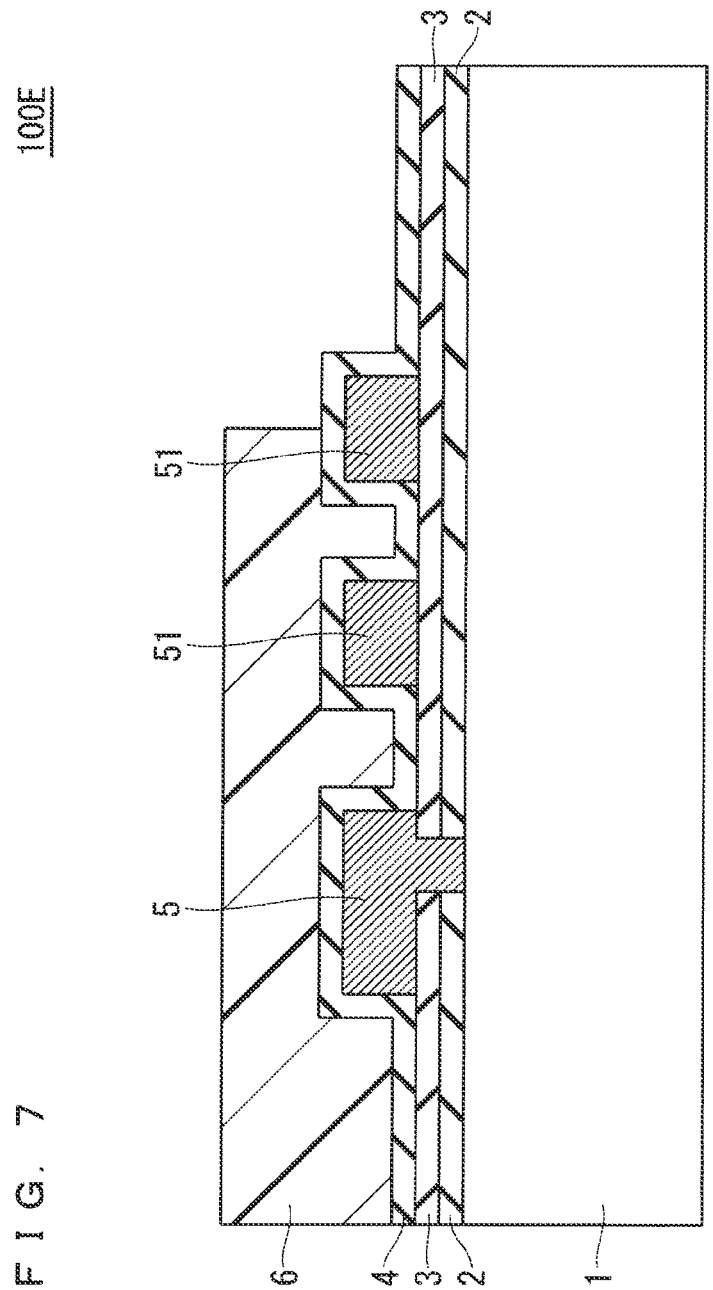
FIG. 7 is a partial cross-sectional view illustrating the chip outermost peripheral region of a semiconductor device in Embodiment 6 according to the present invention.

FIG. 7 is a partial cross-sectional view illustrating the chip outermost peripheral region of a diode chip 100E in Embodiment 6 according to the present invention, and illustrates only a characteristic configuration for the sake of convenience as with FIG. 2.

As illustrated in FIG. 7, the diode chip 100E includes, in the chip outermost peripheral region, the interlayer dielectric 3 disposed as the film underlying the passivation film 4 and being in contact with the passivation film 4, the silicon oxide film 2 disposed under the interlayer dielectric 3, and a plurality of dummy electrodes 51 arranged on the interlayer dielectric 3 concentrically with the field stop electrode 5 and covered also with the passivation film 4.

As described above, the plurality of dummy electrodes 51 are arranged under the passivation film 4 in the chip outermost peripheral region, so that the function to buffer stress on the semiconductor substrate 1 is enhanced to further reduce stress in the semiconductor substrate 1.

The plurality of dummy electrodes 51 increase irregularities in the passivation film 4, and the polyimide film 6 engages the irregularities. This makes the polyimide film 6 less likely to be separated due to an anchor effect to improve adhesion of the polyimide film 6.

The anchor effect refers to an effect produced by irregularities in a surface due to an increase in effective area of a film joined to the surface to enhance a joining force.

Embodiment 7

Figure 8:
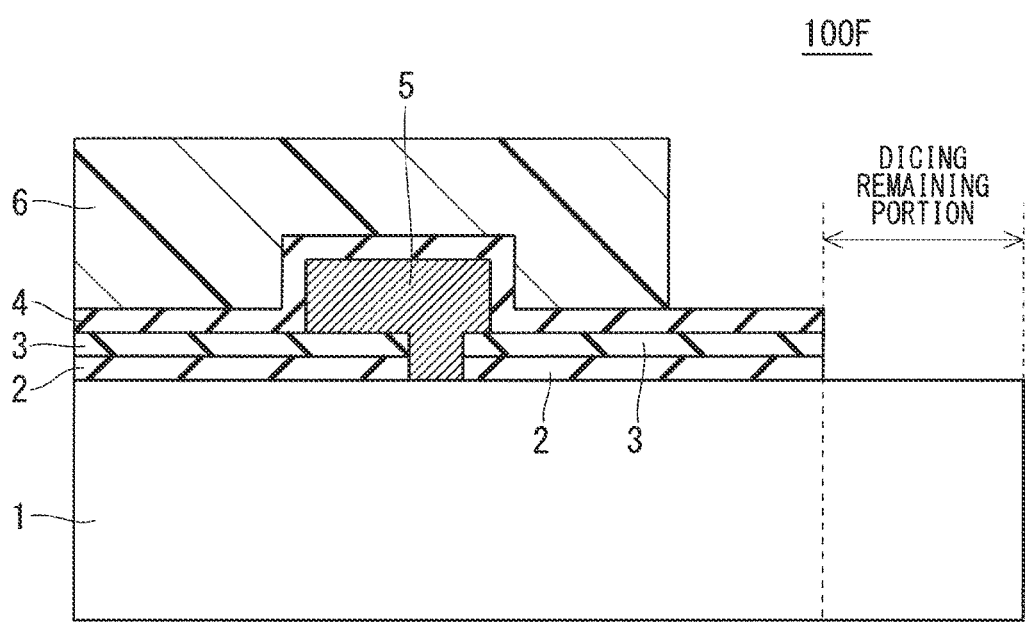
FIG. 8 is a partial cross-sectional view illustrating the chip outermost peripheral region of a semiconductor device in Embodiment 7 according to the present invention.

FIG. 8 is a partial cross-sectional view illustrating the chip outermost peripheral region of a diode chip 100F in Embodiment 7 according to the present invention, and illustrates only a characteristic configuration for the sake of convenience as with FIG. 2.

As illustrated in FIG. 8, the diode chip 100F does not include, in the dicing remaining portion of the chip outermost peripheral region, the passivation film 4, the interlayer dielectric 3, and the silicon oxide film 2, and thus a surface of the semiconductor substrate 1 is exposed.

As described above, the surface of the semiconductor substrate 1 is exposed in the dicing remaining portion of the chip outermost peripheral region of the diode chip 100F. In the form of a wafer, however, this portion is the diced portion, and a portion to be cut at dicing, so that it means that the surface of the semiconductor substrate 1 is exposed in the diced portion.

Since the surface of the semiconductor substrate 1 is exposed in the diced portion, the semiconductor substrate 1 is directly cut with a cutting edge (blade) for dicing at dicing, so that chipping of a cutting plane can be reduced, and the life of the cutting edge can be extended.

Embodiment 8

FIG. 9 is a partial cross-sectional view illustrating the chip outermost peripheral region of a diode chip 100G in Embodiment 8 according to the present invention, and illustrates only a characteristic configuration for the sake of convenience as with FIG. 2.

As illustrated in FIG. 9, the diode chip 100G includes, in the chip outermost peripheral region, the interlayer dielectric 3 disposed as the film underlying the passivation film 4 and being in contact with the passivation film 4, and the silicon oxide film 2 disposed under the interlayer dielectric 3, and the polyimide film 6 has a gradually sloping surface that is convex downward at an end edge thereof.

As described above, the polyimide film 6 has the gradually sloping surface at the end edge thereof in the chip outermost peripheral region, so that stress applied to an end edge of the semiconductor substrate 1 is reduced compared with the polyimide film 6 having a rapidly rising end edge as in the diode chip 100B illustrated in FIG. 4, for example.

Although the polyimide film 6 has the sloping surface that is convex downward at the end edge thereof in FIG. 9, the shape of the polyimide film 6 at the end edge thereof is not limited to this shape. The polyimide film 6 may have a simply sloping surface, and may have any surface, such as a stepped surface, as long as the polyimide film 6 has a film thickness gradually decreasing outward.

Embodiment 9

Figure 10:
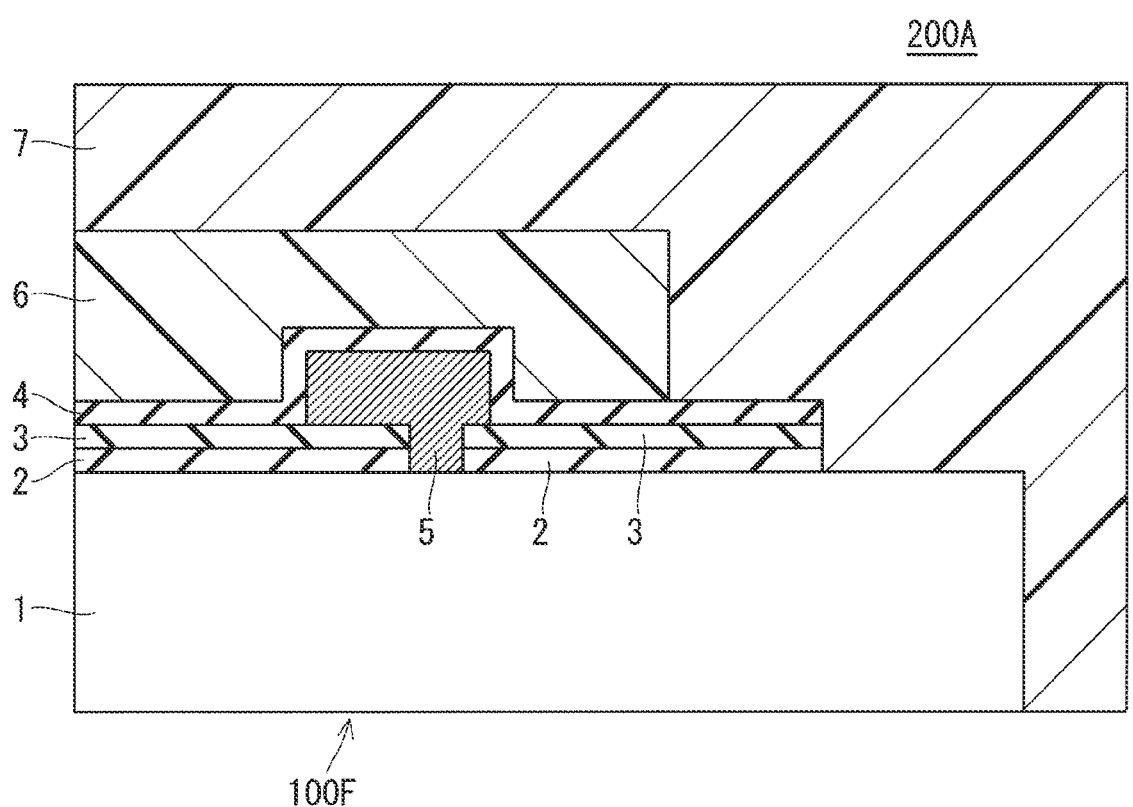
FIG. 10 is a partial cross-sectional view illustrating the chip outermost peripheral region of a semiconductor module in Embodiment 9 according to the present invention.

FIG. 10 is a partial cross-sectional view illustrating the chip outermost peripheral region of a diode module 200A in Embodiment 9 according to the present invention, and illustrates only a characteristic configuration for the sake of convenience as with FIG. 2.

The diode module 200A illustrated in FIG. 10 is a semiconductor chip obtained by sealing the diode chip 100F in Embodiment 7 described with reference to FIG. 8 with a resin. In the diode module 200A, the polyimide film 6 is disposed in the active region and the termination region except for the dicing remaining portion, and the semiconductor substrate 1 as a whole including the polyimide film 6 is sealed with the resin sealing material 7, such as the epoxy resin.

In the diode chip 100F, the passivation film 4 is formed as the film underlying the polyimide film 6 in the chip outermost peripheral region. The physical property values of the material for the passivation film 4 are closer to those of the polyimide film 6 and the resin sealing material 7 than those of the semiconductor substrate 1 are, so that a strain of the semiconductor substrate 1 when thermal stress is applied to the diode chip 100F is reduced. Furthermore, the passivation film 4 itself acts as the buffer film when stress is applied, so that stress in the semiconductor substrate 1 at the end edge of the polyimide film 6 is reduced, and the occurrence of cracking can be suppressed.

Thus, when thermal stress is applied to the diode module 200A obtained by sealing the diode chip 100F with the resin sealing material 7, stress applied from the resin sealing material 7 to the diode chip 100F can be reduced to suppress the occurrence of cracking of the polyimide film 6 to thereby increase reliability.

Although the diode module 200A is described to include the diode chip 100F above, the diode chip is not limited to the diode chip 100F, and any of the diode chips 100A to 100E and 100G illustrated in FIGS. 2 to 7 and 9 may be included.

Embodiment 10

FIG. 11 is a partial cross-sectional view illustrating the chip outermost peripheral region of a diode module 200B in Embodiment 10 according to the present invention, and illustrates only a characteristic configuration for the sake of convenience as with FIG. 2.

The diode module 200B illustrated in FIG. 11 is a semiconductor chip obtained by sealing the diode chip 100E in Embodiment 7 described with reference to FIG. 8 with a resin. The diode module 200B includes an upper passivation film 41 disposed to cover the surface of the polyimide film 6 and the surface in the chip outermost peripheral region of the diode chip 100F.

The upper passivation film 41 includes a TEOS oxide film. Adhesion at an interface between the TEOS oxide film and the epoxy resin is lower than adhesion at the interface between the epoxy resin and polyimide, and the resin sealing material 7 and the upper passivation film 41 are likely to be separated from each other when the diode chip 100F is sealed with the resin sealing material 7. When thermal stress is applied to the diode module 200B, separation at the interface between the resin sealing material 7 and the upper passivation film 41 is promoted, and stress applied from the resin sealing material 7 to the diode chip 100F can further be reduced, and the occurrence of cracking of the polyimide film 6 can be suppressed to increase reliability.

Although the diode module 200B is described to include the diode chip 100F above, the diode chip is not limited to the diode chip 100F, and any of the diode chips 100A to 100E and 100G illustrated in FIGS. 2 to 7 and 9 may be included. In any of the diode chips, an effect similar to the above-mentioned effect can be obtained when the upper passivation film 41 is disposed to cover the surface of the polyimide film 6 and the surface in the chip outermost peripheral region.

Embodiment 11

FIG. 12 is a partial cross-sectional view illustrating the chip outermost peripheral region of a diode module 200C in Embodiment 11 according to the present invention, and illustrates only a characteristic configuration for the sake of convenience as with FIG. 2.

The diode module 200C illustrated in FIG. 12 is a semiconductor chip obtained by sealing the diode chip 100F in Embodiment 7 described with reference to FIG. 8 with a resin. The diode module 200C includes a stress buffer film 15 disposed to cover the surface of the polyimide film 6 and the surface in the chip outermost peripheral region of the diode chip 100F.

The stress buffer film 15 includes a silicone gel or silicone rubber typically used as an insulating sealing material for a semiconductor product.

The stress buffer film 15 is formed by applying the silicone gel or the silicone rubber to the surface of the polyimide film 6 and the surface in the chip outermost peripheral region of the diode chip 100F. The stress buffer film 15 can further reduce stress applied from the resin sealing material 7 to the diode chip 100F, and suppresses the occurrence of cracking of the polyimide film 6 to increase reliability.

Embodiment 12

Figure 13:
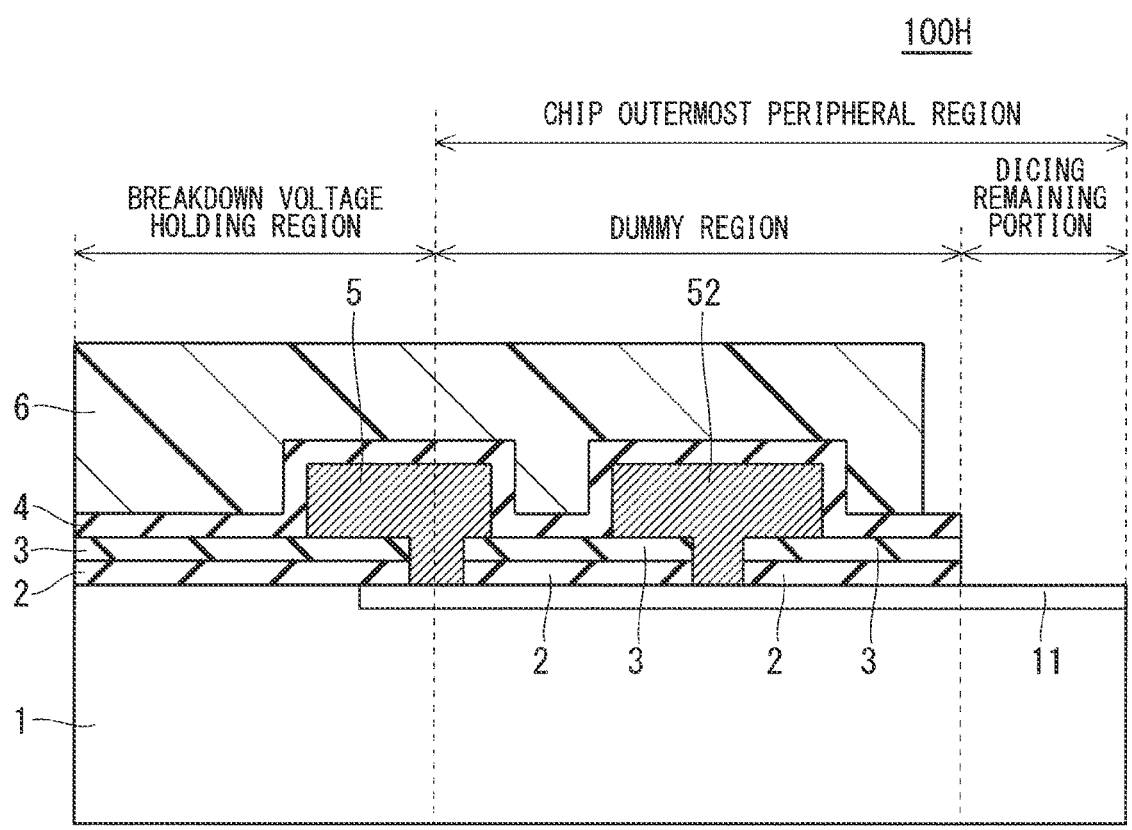
FIG. 13 is a partial cross-sectional view illustrating the chip outermost peripheral region of a semiconductor device in Embodiment 12 according to the present invention.

FIG. 13 is a partial cross-sectional view illustrating the chip outermost peripheral region of a diode chip 100H in Embodiment 12 according to the present invention, and illustrates only a characteristic configuration for the sake of convenience as with FIG. 2.

As illustrated in FIG. 13, in the diode chip 100H, the chip outermost peripheral region includes a dummy region between the breakdown voltage holding region and the dicing remaining portion.

In the dummy region, a dummy electrode 52 is disposed concentrically with the field stop electrode 5 disposed in the breakdown voltage holding region, and the dummy electrode 52 is covered also with the passivation film 4. The polyimide film 6 is disposed in the active region and the termination region except for the dicing remaining portion, and the passivation film 4, the interlayer dielectric 3, and the silicon oxide film 2 are the films underlying the polyimide film 6.

The dummy electrode 52 is disposed on the interlayer dielectric 3, but has a portion reaching, through the interlayer dielectric 3 and the silicon oxide film 2, the field stop layer 11 disposed in an upper portion of the semiconductor substrate 1.

The dummy electrode 52 is made of the same material as the field stop electrode 5, such as AlSi, and is formed by the same manufacturing method as the field stop electrode 5, such as vapor deposition and sputtering.

AlSi is the electrode material used in the manufacture of the semiconductor device. If the anode electrode 14 illustrated in FIG. 1 is formed of AlSi, the step of forming the dummy electrode 52 can double as the step of forming the anode electrode 14 to eliminate the need to add the step of forming the anode electrode 14. The same applies to the field stop electrode 5.

As described above, the chip outermost peripheral region includes the dummy region in which the dummy electrode 52 is disposed. If cracking of the passivation film 4 occurs when thermal stress is applied to the diode chip 100H, and develops to the breakdown voltage holding region, electrical characteristics including a breakdown voltage of the diode chip 100H can be reduced. The dummy electrode 52 disposed in the dummy region is a metal layer and is a ductile material. Even if cracking of the passivation film 4 occurs, the dummy electrode 52 can significantly be plastically deformed before being broken, and can retard development of cracking to the breakdown voltage holding region without propagating cracking at a high speed or can stop development of cracking in the dummy region, so that improvement in reliability and extension of the life of the diode chip 100H can be expected.

Application to Silicon Carbide Semiconductor Device

In Embodiments 1 to 12 described above, description is made based on the assumption that the semiconductor substrate 1 is an Si substrate, and the diode chips 100 to 100H are Si semiconductor devices. When the semiconductor substrate 1 is a wide bandgap semiconductor substrate, such as a silicon carbide semiconductor substrate, the size of the termination region can be reduced to allow for miniaturization of the semiconductor device.

The semiconductor device formed of a wide bandgap material, such as silicon carbide (SiC), can be used in high-temperature high-breakdown voltage applications.

While the present invention has been described in detail, the foregoing description is in all aspects illustrative and not restrictive. It is therefore understood that numerous modifications not having been described can be devised without departing from the scope of the present invention.

Embodiments of the present invention can freely be combined with each other, and can be modified or omitted as appropriate within the scope of the invention.

The invention claimed is:

1. A semiconductor device comprising:
a semiconductor substrate having:
an active region through which a main current flows; and
a termination region around the active region;
a polyimide film disposed in the active region and the termination region; and
a passivation film disposed as a film underlying the polyimide film, wherein
the termination region includes, in order from a side of the active region, a breakdown voltage holding region and an outermost peripheral region, the polyimide film is disposed except for a dicing remaining portion of the outermost peripheral region,
the passivation film is a single material,
the passivation film is disposed under an entirety of the polyimide film in an entirety of the semiconductor device, and
the passivation film extends continuously beyond the polyimide film to an outermost peripheral end of the semiconductor substrate including the dicing remaining portion of the semiconductor substrate.

2. The semiconductor device according to claim 1, further comprising
an interlayer dielectric disposed in the outermost peripheral region as a film underlying the passivation film.

3. The semiconductor device according to claim 2, further comprising
a thermal oxide film disposed in the outermost peripheral region as a film underlying the interlayer dielectric.

4. The semiconductor device according to claim 3, further comprising
a polysilicon film disposed, in the outermost peripheral region, between the interlayer dielectric and the thermal oxide film.

5. The semiconductor device according to claim 2, further comprising:
a field stop electrode disposed, in the breakdown voltage holding region, on the interlayer dielectric concentrically with the active region; and
at least one dummy electrode disposed, in the outermost peripheral region, on the interlayer dielectric concentrically with the field stop electrode.

6. The semiconductor device according to claim 5, wherein
the at least one dummy electrode comprises a plurality of dummy electrodes arranged concentrically.

7. The semiconductor device according to claim 1, wherein
the passivation film comprises a TEOS oxide film.

8. The semiconductor device according to claim 1, wherein
the semiconductor substrate comprises a silicon carbide semiconductor substrate.

9. A semiconductor module comprising:
the semiconductor device according to claim 1; and
a resin sealing material with which the semiconductor device is sealed.

10. The semiconductor device according to claim 1, further comprising:
a first electrode disposed in the active region; and
a field stop electrode disposed in the termination region, wherein
the first electrode is spaced from the field stop electrode by the passivation film,
the passivation film directly contacts each of the first electrode and the field stop electrode, and
a portion of the polyimide film is positioned directly between the first electrode and the field stop electrode, the portion of the polyimide film being spaced from each of the first electrode and the field stop electrode by the passivation film.

11. The semiconductor device according to claim 1, wherein an end surface of the passivation film is flush with an end surface of the semiconductor substrate.

12. The semiconductor device according to claim 1, wherein the passivation film extends into the dicing remaining portion of the outermost peripheral region.

13. The semiconductor module according to claim 9, wherein the passivation film has a Young's modulus and a coefficient of linear expansion closer to a Young's modulus and a coefficient of linear expansion of the polyimide film and the resin sealing material than to a Young's modulus and a coefficient of linear expansion of the semiconductor substrate.

14. The semiconductor device according to claim 1, wherein the passivation film is disposed under the entirety of the polyimide film such that the passivation film is between the semiconductor substrate and all parts of the polyimide film in a direction perpendicular to the semiconductor substrate.

* * * * *